(12) United States Patent
Wayman

(10) Patent No.: US 7,515,420 B2
(45) Date of Patent: Apr. 7, 2009

(54) APPARATUS FOR TRANSFERRING HEAT BETWEEN TWO CORNER SURFACES

(75) Inventor: Michael J. Wayman, Waconia, MN (US)

(73) Assignee: ADC Telecommunications, Inc., Eden Prairie, MN (US)

(*) Notice: Subject to any disclaimer, the term of this patent is extended or adjusted under 35 U.S.C. 154(b) by 0 days.

(21) Appl. No.: 11/691,970

(22) Filed: Mar. 27, 2007

(65) Prior Publication Data
US 2008/0239673 A1 Oct. 2, 2008

(51) Int. Cl.
H05K 7/20 (2006.01)

(52) U.S. Cl. .................. 361/704; 361/708; 361/720; 361/721; 361/685; 165/80.3; 165/104.33; 165/185

(58) Field of Classification Search ............. 361/687, 361/702–712, 714–717, 719–712, 724–728; 174/15.1, 16.3, 252; 257/706–727; 165/80.2, 165/80.3, 80.4, 80.5, 104.33, 185
See application file for complete search history.

(56) References Cited

U.S. PATENT DOCUMENTS

| 4,459,639 | A | * | 7/1984 | Heil et al. | 361/720 |
| 4,475,145 | A | * | 10/1984 | Heil et al. | 361/720 |
| 4,849,858 | A | * | 7/1989 | Grapes et al. | 361/708 |
| 4,867,235 | A | * | 9/1989 | Grapes et al. | 165/185 |
| 5,028,989 | A | * | 7/1991 | Naganuma et al. | 257/714 |
| 5,060,115 | A | * | 10/1991 | Sewell | 361/710 |
| 5,218,517 | A | * | 6/1993 | Sewell | 361/710 |
| 5,220,485 | A | * | 6/1993 | Chakrabarti | 361/720 |
| 5,251,099 | A | * | 10/1993 | Goss et al. | 361/721 |
| 5,262,587 | A | * | 11/1993 | Moser | 174/15.1 |
| 5,284,095 | A | * | 2/1994 | Sabah | 102/293 |
| 5,398,748 | A | * | 3/1995 | Yamaji et al. | 165/80.2 |
| 6,480,386 | B1 | * | 11/2002 | Yu | 361/704 |

* cited by examiner

Primary Examiner—Michael V Datskovskiy
(74) Attorney, Agent, or Firm—Fogg & Powers LLC

(57) ABSTRACT

An apparatus for transferring heat between two corner surfaces is provided. In one embodiment, an apparatus for transferring heat between two corner surfaces is provided. The apparatus comprises a heat transfer body comprising: a first heat conducting side; a second heat conducting side intersecting with the first heat conducting side to form a corner; and a contact face oriented at an acute angle relative the first and second side. The apparatus further comprises at least one wedge having a slip face oriented at an angle configured to interface with the contact face; and at least one fastener configured to apply a force to the at least one wedge. The wedge is configured to translate the force applied by the fastener into a first component in a direction normal to the first heat conducting side and a second component in a direction normal to the second heat conducting side.

23 Claims, 2 Drawing Sheets

APPARATUS FOR TRANSFERRING HEAT BETWEEN TWO CORNER SURFACES

CROSS REFERENCE TO RELATED APPLICATIONS

This application is related to U.S. patent application Ser. No. 11/692,026 having a title of "MODULARIZED RF BAND COMPONENTS ON REMOVABLE DOORS" (also referred to here as the '840 Application), and U.S. patent application Ser. No. 11/692,000 having a title of "NATURAL FORCED CONVECTION COMBINATION HEAT SINK" (also referred to here as the '838 Application) both of which are filed on even date herewith. The '840 and '838 Applications are hereby incorporated herein by reference.

BACKGROUND

Electronic devices often generate a considerable amount of heat that must be effectively removed to keep the device and associated systems in proper working order. The most effective way to remove heat is via conduction. Conduction requires direct contact between two conducting surfaces. Once contact between the surfaces has been made, heat will naturally flow from the surface with more heat to the surface with less heat. Among other things, the amount of heat transfer is dependent upon the contact pressure between the two surfaces. The higher the force pressing the two surfaces together the higher the heat transfer from one surface to the other.

Because conduction is generally the most effective form of heat dissipation, almost all electronic devices conduct heat away from their body with the use of a heat sink. A heat sink is an apparatus made from a heat conducting material that has a flat face on one side which is abutted against a surface on the electronic device. The heat sink draws heat from a surface of electronic device to a plurality of fins on the other side of the heat sink that are exposed to the air. The fins of the heat sink act to increase the surface area available for heat dissipation by drawing heat from the electronic device to the fins and releasing the heat into the air.

Electronic devices, however, radiate heat off of all sides, and heat sinks generally draw heat from only one surface on the electronic device. Attempts have been made to extract heat from additional sides of the device. These attempts, however, are either prohibitively expensive, too large, or not easily adaptable to varying situations. For example, sometimes a separate heat sink is attached with a fastener, or set of fasteners, to one side of the electronic device and then a second fastener, or set of fasteners, attaches the heat sink to a primary heat sink. This approach is often problematic due to the large number of fasteners required, the clearance required to access the fasteners that attach the heat sink to the electronic device, and the fact that often the electronic device to be cooled does not include features for accepting the fastener connections to the heat sink.

For the reasons stated above, and for other reasons stated below which will become apparent to those skilled in the art upon reading and understanding the present specification, there is a need in the art for a cost effective and compact heat transfer mechanism that can be applied to the side of an electronic device.

SUMMARY

The above-mentioned problems of current systems are addressed by embodiments of the present invention and will be understood by reading and studying the following specification. The following summary is made by way of example and not by way of limitation. It is merely provided to aid the reader in understanding some of the aspects of the invention.

An apparatus for transferring heat between two corner surfaces is provided. In one embodiment, an apparatus for transferring heat between two corner surfaces is provided. The apparatus comprises a heat transfer body comprising: a first heat conducting side; a second heat conducting side intersecting with the first heat conducting side to form a corner; and a contact face oriented at an acute angle relative the first and second side. The apparatus further comprises at least one wedge having a slip face oriented at an angle configured to interface with the contact face; and at least one fastener configured to apply a force to the at least one wedge. The wedge is configured to translate the force applied by the fastener into a first component in a direction normal to the first heat conducting side and a second component in a direction normal to the second heat conducting side.

BRIEF DESCRIPTION OF THE DRAWINGS

The present invention can be more easily understood, and further advantages and uses thereof are more readily apparent, when considered in view of the detailed description and the following figures in which.

In accordance with common practice, the various described features are not drawn to scale but are drawn to emphasize specific features relevant to the present invention. Like reference characters denote like elements throughout the Figures and text.

DETAILED DESCRIPTION

In the following detailed description, reference is made to the accompanying drawings that form a part hereof, and in which is shown by way of illustration specific illustrative embodiments in which the method and system may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Embodiments of the present invention provide a heat transfer device for lateral heat dissipation from a heat generating device. The heat transfer device facilitates heat transfer from the side of a heat generating device to a heat dissipating surface which meets with the side of the heat generating device to form an inside corner. The heat transfer device draws heat from the side of the heat generating device and allows the heat to flow into the heat dissipating surface. Notably, the heat transfer device places pressure on both surfaces forming the inside corner, but requires only a single axial force directed towards one of the surfaces. More detail regarding the heat transfer system and its use will now be provided with reference to FIGS. 1A, 1B, and 2.

Figure 1B:
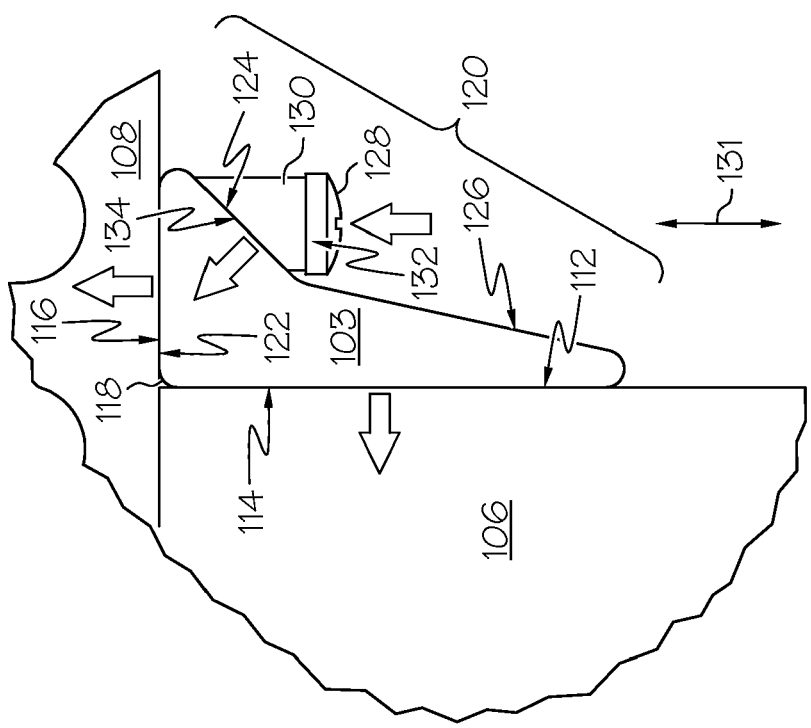
FIG. 1B is a close-up cross-sectional view of a corner heat transfer device from FIG. 1A of one embodiment of the present invention.
Figure 1A:
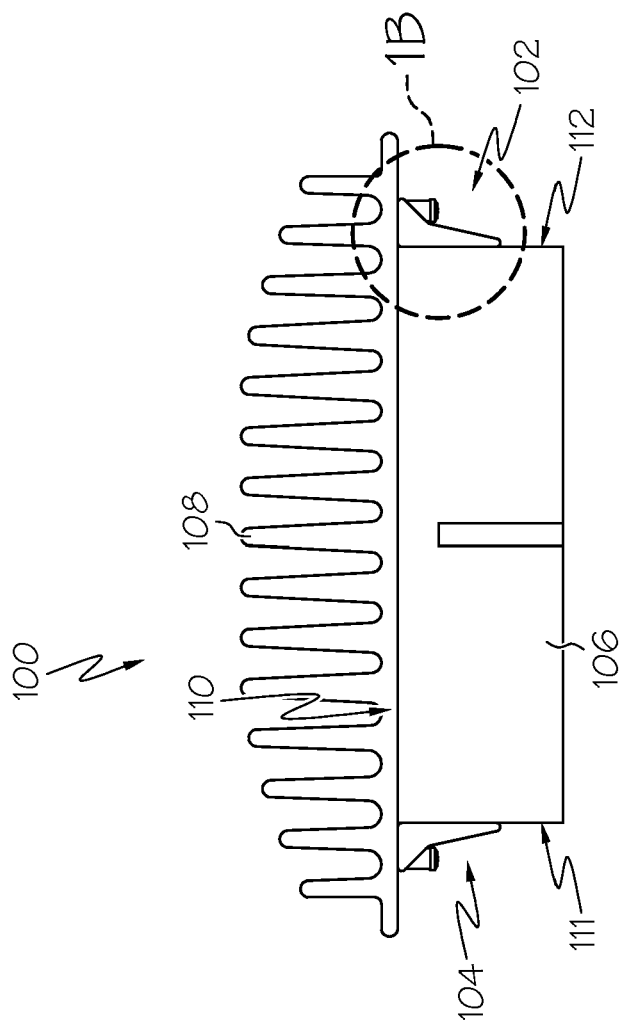
FIG. 1A is cross-sectional view of a heat transfer system according to one embodiment of the present invention.

FIGS. 1A and 1B illustrate a heat transfer system 100 using one embodiment of the present invention. System 100 includes a first corner heat sink 102, a second corner heat sink 104, and a primary heat sink 108. In this embodiment, heat transfer system 100 aids in removing heat from an electronic device 106. Electronic device 106 is a heat generating component and primary heat sink 108 is mounted directly to surface 110 (base) of electronic device 106. Primary heat sink 108 draws a large amount of heat directly from base 110 of electronic device 106. Corner heat sinks 102, 104 supplement heat dissipation from electronic device 106 by drawing heat from additional surfaces of electronic device 106. In this embodiment, the additional surfaces are sides 111, 112 of electronic device, although corner heat sinks 102, 104 could draw heat from any heat dissipation surface of electronic device 106. Corner heat sinks 102, 104 create a heat conduction path from sides 111, 112 to primary heat sink 108. In this embodiment, heat sinks 102 and 104 are identical. As a result, the general description and functions will be explained with reference to heat sink 102 alone, however, it is understood that the explanation also applies to heat sink 104.

Referring now to FIG. 1B, in this illustrative embodiment, corner heat sink 102 has a heat transferring body 103 having two sides 114, 116 which intersect to form a corner 118. First side 114 and second side 116 are heat conducting surfaces that allow the flow of heat to and from an opposing heat conducting surface. For example, as shown in FIG. 1B, heat is allowed to flow between first side 114 and surface 112 which is abutted against first side 114. Likewise, heat is also allowed to flow between second side 116 and surface 108. Corner heat sink 102 also allows heat transfer between first side 114 and second side 116 when heat is transferred into corner heat sink. In this embodiment, corner heat sink 102 is composed of a metal, such as aluminum, copper, or steel, and heat transfer between first side 114 and second side 116 occurs through body 103 of corner heat sink 102.

The more precisely that sides 114, 116 align with heat conducting surfaces 112, 122 the lower the contact resistance between the surfaces. The lower the contact resistance the better the heat transfer that can occur. As shown, corner 118 is an outside corner, meaning that corner 118 forms an outward projecting point. In this embodiment, first side 114 and second side 116 meet such that corner 118 is approximately 90 degrees. This angle of corner 118 matches a corner formed between heat conducting surface 112 on electronic device 106 and heat conducting surface 122 on primary heat sink 108. The corner formed by surface 112 and surface 122 is an inside corner, meaning the two surfaces meet to form an inward crevice. In this embodiment, this inside corner is approximately 90 degrees. Although for this illustrative embodiment, corner 118 is shown as 90 degrees, the present invention is not intended to be so limited. For example, corner 118 could form a larger or smaller angle to match a correspondingly angled corner between heat conducting surfaces 112, 122. In this embodiment, corner 118 has a slightly rounded contour. This enables first side 114 and second side 116 to make good contact with first heat conducting surface 112 and second heat conducting surface 122. Alternatively, corner 118 could come to a sharp point, form a chamfer, or be any other shape that allows sufficient contact between first side 114, second side 116, and first heat conducting surface 112, second heat conducting surface 122 respectively.

In this embodiment, first heat conducting surface 112 is on electronic device 106 and second heat conducting surface 122 is on primary heat sink 108. It is to be understood, however, that corner heat sink 102 can be placed between any two heat conducting surfaces on any device(s) or structure(s) as desired.

Heat sink 102 also includes a contact face 124 on body 103 and a wedge 130 which work together to enable each side 114, 116 to place pressure on opposing surface 112, 122 respectively. Contact face 124 is oriented at an acute angle relative to both first side 114 and second side 116 so that pressure applied to contact face 124 is translated into pressure against both surface 112 and surface 108. Wedge 130 has an aperture (shown at FIG. 2 at 201) that is aligned with another aperture (shown in FIG. 2 at 202) in heat transferring body 103. Aperture 201 in wedge 130 and aperture 202 in heat sink 102 define a longitudinal axis 131. Wedge 130 also has a slip face 134 which is oriented at an angle relative to longitudinal axis 131. The angle of slip face 134 is selected as the complementary angle to the angle of contact face 124, meaning that slip face 134 is parallel to contact face 124. Wedge 130 also has a flat end 132 oriented perpendicular to longitudinal axis 131 upon which bolt 128 applies pressure.

In this embodiment, wedge 130 is an annular cylindrical bushing open at both ends, however, the present invention is not intended to be so limited. For example, wedge 130 could be a triangular shaped piece, or any other shape having a flat end 132, a slip face 134, and an aperture 201.

In use, corner heat sink 102 is placed into the corner between heat conducting surface 112, and heat conducting surface 122. To secure heat sink 102 to surface 108, slip face 134 is placed against contact surface 124 and wedge 130 is aligned with aperture 202 in heat sink 102. In this embodiment, aperture 202 is cylindrical in shape and extends through heat sink 102. Aperture 202 is used to accept a bolt 128 which applies the initial pressure to heat sink 102. Aperture 202 opens on one end at contact face 124, and opens on the other end at side 116. Both wedge 130 and aperture 202 in heat sink 102 are aligned with a threaded aperture (shown in FIG. 2 at 204) in primary heat sink 108. Bolt 128 is placed through wedge 130 through the aperture in heat sink 102 and screwed into primary heat sink 108. Heat sink 102 is now mounted to primary heat sink 108. Although, in this illustrative embodiment, a bolt 128 is used to mount heat sink 102 to primary heat sink 108, the present invention is not intended to be so limited and can include other fasteners such as but not limited to a screw, a rivet, a mechanical clamp, or other means of compression.

Bolt 128 provides the force for corner heat sink 102 to apply pressure against both heat conducting surfaces 112, 122. As bolt 128 is tightened upward, force is applied upon flat end 132 of wedge 130 in a direction towards second side 116 of corner heat sink 102. The angle of slip face 134 and contact face 124 creates a slip plane which deflects by the force applied to wedge 130 in a direction perpendicular (i.e. normal) to contact face 124 and slip face 134. This angled force results in two axial forces one against each heat conducting surface 112, 122. Thus, contact face 124 and slip face 134 translate a single axial force directed towards a single side of heat sink 102 into two forces, one on both sides 114, 116 of corner heat sink 102.

In this embodiment, contact face 124 and slip face 134 of wedge 130 direct the angled force at 45 degrees, thus making the axial force against each heat conducting surface 112, 122 equal. The angled force is directed at 45 degrees, because contact face 124 is oriented at 45 degrees relative to both first side 114 and second side 116 of corner heat sink 102. Additionally, slip face 134 is beveled at 45 degrees relative to longitudinal axis 131, which complements the 45 degree angle of contact face 124. Thus, in this embodiment, contact face 124 and slip face 134 deflect the axial force equally onto each of side 114 and side 116.

The present invention, however, is not intended to be limited to a 45 degree angled contact face 124 and slip face 134. Notably, the amount of force placed by side 114 and side 116 is determined by the angle of contact face 124 and second end 134 of wedge 130. To have side 114 place more force comparatively than side 116, the angle of contact surface 124 and second end 134 should be set at an angle closer to first side 114, e.g. 30 degrees relative to first side 114. Conversely, to have side 116 place more force comparatively than side 114, the angle of contact surface 124 and second end 134 should be set at an angle closer to second side 116 (e.g. 60 degrees relative to first side 114). For example, as illustrated in FIG. 1B first side 114 is longer than second side 116. Because of the increased length of first side 114, it may be advantageous to have side 114 press with greater force than by side 116. In this situation, contact face 124 could be oriented at 60 degrees relative to side 116. In this embodiment, slip face 134 would be beveled at 30 degrees relative to longitudinal axis 131 to match the 60 degree contact face 124. In any event, to provide force to both sides 114, 116 contact face 124 should be oriented at an acute angle (i.e. between 0 and 90 degrees) relative to each side 114, 116.

Referring back to FIG. 1B, in this embodiment, body 103 of heat sink 102 has a generally triangular shape with three major sides 114, 116, 120. In this embodiment, third side 120 of corner heat sink 102 includes two faces; contact face 124, and a lower face 126. Lower face 126 is oriented at a different angle than contact face 124 and makes up the rest of third side 120. Splitting third side 120 into contact face 124 and lower face 126 gives corner heat sink 102 a compact shape while still allowing sufficiently sized heat conducting sides 114, 116. Contact face 124 and lower face 126 are oriented so that third side 120 bends inward. This allows contact face 124 to be oriented at the desired angle (e.g. 45 degrees) while still allowing flexibility in the selected size of sides 114, while maintain a compact structure. Additionally, this allows heat transfer body 103 to have a compact shape and size, thus providing additional clearance for other structures.

Although for this illustrative embodiment, body 103 of heat sink 102 is shown having a generally triangular shape with contact face on a third side of the triangle, the present invention is not intended to be so limited. For example, body 103 could be generally square shaped having four sides, with two of the sides intersecting to form a heat transfer corner. In this embodiment, one of the sides of the square not forming the heat transfer corner has a contact face angled obliquely relative to the other sides of the heat sink. Thus, similar to that described with respect to FIGS. 1A and 1B, a bushing can be applied to the contact face of the heat sink and cause a force to be exerted by both sides of the heat transfer corner. Alternatively, any shaped device having a first side and a second side which intersect to form a corner; and having a contact face oriented to cause both the first and second sides to place pressure on respective corresponding surfaces can be used. In yet another embodiment, third side 120 could have a single face, or more than two faces as long as one face was a contact face oriented at the desired angle so that both first side 114 and second side 116 place force on their respective heat conducting surfaces 112, 122.

As shown in FIG. 1B, corner heat sink 102 has rounded corners between third side 120 and both first side 114 and second side 116. The rounded corners provide manufacturing improvement if the heat sink is to be extruded. The rounded corners also provide added safety over corners that come to a point, however, corner heat sink 102 need not have rounded corners. For example, the corners could come to a point as mentioned earlier, have a small flat edge, or be any other shape as known to those skilled in the art.

Figure 2:
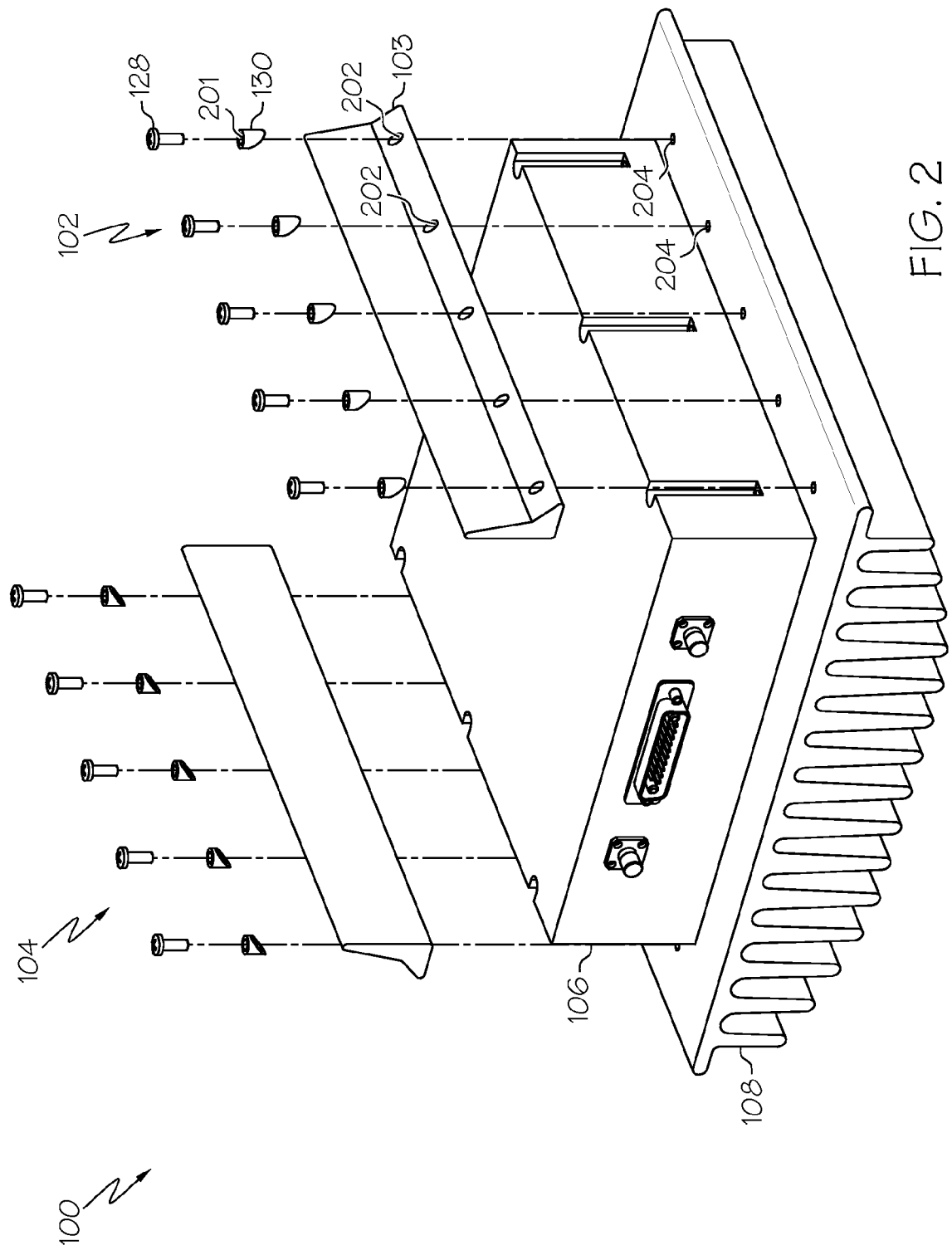
FIG. 2 is a partially exploded perspective view of the heat transfer system of FIG. 1A of one embodiment of the present invention.

FIG. 2 illustrates a partially exploded view of a device including corner heat sinks 102, 104. Primary heat sink 108 is mounted to electronic device 106 to allow heat transfer from the base of electronic device 106. To increase the heat transfer to primary heat sink 108, corner heat sinks 102, 104 are mounted along two sides of electronic device 108 in order to allow heat transfer from those two sides of electronic device 106 through the respective corner heat sink 102, 104 and into primary heat sink 108. Alternatively, any number of corner heat sinks could be used. For example, only one corner heat sink could be utilized on a single side of electronic device 106. In another example, four corner heat sinks are used; one on each side of electronic device 106.

Corner heat sink 102 is placed into a corner between electronic device 106 and primary heat sink 108. Corner heat sink 102 has five (5) apertures 202 for mounting corner heat sink 102 to primary heat sink 108. Each aperture 202 is aligned with a corresponding threaded aperture 204 in primary heat sink 108. Five bushings 130 are then aligned, one with each aperture, and five bolts 128, one for each are placed through each wedge 130 and aperture 202. Bolts 128 are then screwed into aperture 204 in primary heat sink 108. The process is identical for corner heat sink 104, except that corner heat sink 104 is mounted on the opposite side of electronic device 106. Alternatively, apertures 204 could be unthreaded and bolt 128 could be secured with a nut on the opposite side of primary heat sink 108.

Corner heat sink 102 need not have five (5) apertures 202. The number of apertures 202 and size of bolts 128 are selected based on the desired amount and distribution of force applied by corner heat sink 102. For example, a larger bolt and/or a larger number of apertures 202 will increase the amount of force exerted by corner heat sink 102 on both electronic device 106 and primary heat sink 108. Conversely, a smaller bolt and/or a smaller number of apertures 202 will result in a smaller force exerted by corner heat sink 102 on both electronic device 106 and primary heat sink 108.

In one embodiment, a thermal interface material is placed between each side 114, 116 of corner heat sink 102 and the respective heat conducting surface on electronic device 106 and primary heat sink 108. The thermal interface material fills any air gaps between the two surfaces and increases the thermal transfer efficiency of the interface. Thermal interface material can include thermal pastes, tapes or other substances as is known in the art. In another embodiment, the interfaces between the sides of corner heat sink 102, and electronic device 106 and primary heat sink 108 do not use a thermal interface material. Alternatively, the interfaces may rely solely on the surface to surface contact for heat transfer.

In one embodiment, body 103 of corner heat sink 102 is composed of aluminum. In another embodiment, body 103 of corner heat sink 102 is composed of steel. Alternatively, body 103 could be composed of multiple materials, or any material sufficient to transfer heat from first side 114 to second side 116. In one embodiment, wedge 130 is composed of steel. Alternatively, wedge 130 could be composed of rigid plastic, or any other material rigid enough to withstand the force applied by bolt 128.

The design of corner heat sink 102 allows for cost-effective and easy construction of corner heat sink 102. For example, in one embodiment, body 103 corner heat sink 102 is an aluminum extrusion. Apertures 202 are machined in after extrusion. Since body 103 is extruded, body 103 can be cut to any length as desired to fit the side of an electronic device. Additionally, two or more smaller bodies could be used on the same side of an electronic device if, for example, a connector or other component is present along the side of the electronic device.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. An apparatus for transferring heat between two corner surfaces, the apparatus comprising:
    a heat transfer body comprising:
        a first heat conducting side;
        a second heat conducting side intersecting with the first heat conducting side to form a corner; and
        a third side, wherein the third side comprises a first face forming a contact face, the contact-face oriented at an acute angle relative to both the first side and the second side, and wherein the third side comprises a second face oriented at a different angle than the contact face such that the third side is angled inward;
    at least one wedge having a slip face that is oriented at an angle configured to interface with the contact face of the heat transfer body; and
    at least one fastener configured to apply a force to the at least one wedge;
    wherein the wedge is configured to translate the force applied by the fastener into a first component in a direction normal to the first heat conducting side and a second component in a direction normal to the second heat conducting side.

2. The apparatus of claim 1, wherein the heat transfer body further comprises at least one first aperture that opens from the contact face to the first heat conducting side; and
    wherein the at least one wedge further comprises at least one second aperture configured to align with the at least one aperture in the heat transfer body.

3. The apparatus of claim 2, wherein the first aperture is oriented perpendicular to the first heat conducting side.

4. The apparatus of claim 1, wherein the slip face and the contact face form a slip plane thereby translating a portion of the force applied by the at least one fastener into the first component and the second component.

5. The apparatus of claim 1, wherein the at least one fastener comprises at least one of a bolt, a screw, a rivet, a pin, a peg, or a clamp.

6. The apparatus of claim 1, wherein the heat transfer body is shaped to accommodate adjacent structures.

7. The apparatus of claim 1, wherein an equal amount of force is directed towards the first heat conducting side and the second heat conducting side.

8. The apparatus of claim 1, wherein the slip face of the wedge is oriented at approximately 45 degrees relative to the first heat conducting side.

9. The apparatus of claim 1, wherein the first heat conducting side and the second heat conducting side intersect at approximately 90 degrees.

10. The apparatus of claim 1, wherein the at least one wedge is a bushing having an annular cylindrical shape.

11. The apparatus of claim 1, wherein the heat transferring body is composed of aluminum.

12. The apparatus of claim 1, wherein the wedge is composed of a material harder than the heat transfer body.

13. A system for transferring heat around a corner, the system comprising:
    a heat transfer body having:
        a first side;
        a second side adjacent to the first side, and forming a corner between the first side and the second side; and
        a third side, wherein the third side comprises a first face forming a contact face, the contact face adjacent to at least one of the first side and the second side, the contact face oriented at an acute angle relative to both the first side and the second side, and wherein the third side comprises a second face oriented at a different angle than the contact face such that the third side is angled inward;
    at least one wedge having a slip face at an angle complementary to the angle of the contact face relative to at least one of the first side and the second side; and
    at least one fastener configured to apply a force to the at least one wedge;
    wherein the slip face is configured to interface with the contact face to translate the force applied by the fastener into a first component in a direction normal to the first heat conducting side and a second component in a direction normal to the second heat conducting side.

14. The system of claim 13, wherein the heat transfer body further comprises at least one first aperture opening to both the first side and the contact face side; and
    wherein the at least one wedge further comprises at least one second aperture configured to align with the at least one first aperture of the heat transferring body.

15. The system of claim 13, wherein the slip face and the contact face form a slip plane thereby translating a portion of the force applied by the fastener into the first component and the second component.

16. The system of claim 13, wherein the heat transfer body is shaped to provide clearance for adjacent structures.

17. The system of claim 13, wherein the contact face is oriented at approximately 45 degrees relative to the first side and the second side.

18. The system of claim 13, wherein the heat transferring body has a generally triangular shape.

19. The system of claim 13, wherein the wedge comprises a material harder than the heat transferring body.

20. The system of claim 13, wherein the wedge comprises an annular cylindrical bushing.

21. A system for transferring heat, the system comprising:
    a primary heat sink mounted to a heat generating device and forming a corner between a surface on the primary heat sink and a first surface on the heat generating device, wherein the surface on the primary heat sink contacts a second surface on the heat generating device forming a first heat transfer interface between the primary heat sink and the heat generating device;
    a heat transferring body comprising a first heat conducting side, a second heat conducting side and a contact surface, wherein the heat transferring body is secured into the corner, wherein the first heat conducting side of the heat transferring body is adjacent to the surface of the primary heat sink and the second heat conducting side of the heat transfer body is adjacent to the first surface of the heat generating device, wherein the second heat conducting side of the heat transfer body and the first surface of the heat generating device form a second heat transfer interface, and wherein the first heat transfer interface has a larger heat transfer surface area than the second heat transfer interface;

a wedge having a slip face oriented at a complementary angle to the contact surface; and at least one fastener configured to apply a force to the at least one wedge;

wherein the slip face is configured to interface with the contact face to translate the force applied by the fastener into a first component in a direction normal to the first heat conducting side and a second component in a direction normal to the second heat conducting side.

22. The system of claim 21, wherein the heat transferring body further comprises a first aperture extending through the heat transferring body, the first aperture opening to the contact surface and opening to the first heat conducting side of the heat transferring body; and wherein the wedge further comprises a second aperture configured to align with the first aperture in the heat transferring body.

23. The system of claim 21, wherein the wedge is an annular cylindrical bushing.

* * * * *